United States Patent
Basheer et al.

(10) Patent No.: US 7,332,822 B2
(45) Date of Patent: Feb. 19, 2008

(54) FLIP CHIP SYSTEM WITH ORGANIC/INORGANIC HYBRID UNDERFILL COMPOSITION

(75) Inventors: Rafil Basheer, Rochester Hills, MI (US); Richard M. Laine, Ann Arbor, MI (US); Santy Sulaiman, Ypsilanti, MI (US); Chad M. Brick, Ann Arbor, MI (US); Christopher M. Desana, Ann Arbor, MI (US)

(73) Assignee: Delphi Technologies, Inc., Troy, MI (US)

( * ) Notice: Subject to any disclaimer, the term of this patent is extended or adjusted under 35 U.S.C. 154(b) by 97 days.

(21) Appl. No.: 11/242,741

(22) Filed: Oct. 4, 2005

(65) Prior Publication Data

US 2006/0103029 A1    May 18, 2006

Related U.S. Application Data

(60) Provisional application No. 60/627,412, filed on Nov. 12, 2004.

(51) Int. Cl.
  *H01L 23/28* (2006.01)
  *H01L 23/29* (2006.01)

(52) U.S. Cl. ............ 257/787; 257/789; 257/791; 257/793; 257/E23.119; 257/E23.121; 257/E23.136

(58) Field of Classification Search ........ 257/778, 257/E21.503, 678–733, 787–796, E23.001–E23.194; 438/108
  See application file for complete search history.

(56) References Cited

U.S. PATENT DOCUMENTS 5,204,025 A * 4/1993 Yamada et al. ............ 252/500
5,286,572 A   2/1994 Clodgo et al.
5,811,317 A   9/1998 Maheshwari et al.
6,399,178 B1  6/2002 Chung
6,610,559 B2  8/2003 Wang et al.
6,724,091 B1* 4/2004 Jayaraman et al. ........ 257/778
6,927,301 B2* 8/2005 Laine et al. ............... 556/450
7,060,634 B2* 6/2006 Rantala et al. ............. 438/780
7,088,010 B2* 8/2006 Lim et al. .................. 257/792
7,183,139 B2* 2/2007 Jayaraman et al. ........ 438/118
2003/0069331 A1* 4/2003 Teiichi et al. .............. 523/176
2004/0185603 A1  9/2004 Jayaraman et al.
2006/0041093 A1* 2/2006 Ravikiran et al. .......... 526/282

FOREIGN PATENT DOCUMENTS

EP    0455019    11/1991

OTHER PUBLICATIONS

EP search report dated Mar. 20, 2006.
Tamaki et al, "A polyimide Nanocomposite from Octa (Aminophenyl) Silsesquioxane", Jan. 17, 2003, pp. 793-797.

* cited by examiner

*Primary Examiner*—Jasmine Clark
(74) *Attorney, Agent, or Firm*—Paul L. Marshall

(57) ABSTRACT

A system for underfilling in a chip package includes an underfill mixture that ameliorates the CTE mismatch that typically exists between a packaged die and a resin-impregnated fiberglass mounting substrate. In one embodiment, the system includes an underfill mixture that comprises a principal underfill composition of a rigid octaaminophenyl silsesquioxane (OAPS) that is used as a curing agent for a tetrafunctional, low viscosity, and relatively rigid TGMX epoxy resin. An embodiment is also directed to the assembly of a flip chip package that uses the underfill mixture.

6 Claims, 2 Drawing Sheets

– 1 –

FLIP CHIP SYSTEM WITH ORGANIC/INORGANIC HYBRID UNDERFILL COMPOSITION

RELATED APPLICATION

This invention claims priority to U.S. provisional application Ser. No. 60/627,412 filed Nov. 12, 2004.

BACKGROUND OF THE INVENTION

1. Field of the Invention

The invention is related in general to a packaging integrated circuits, and in particular to a flip chip system with a hybrid underfill mixture that includes properties similar to a molecular level composition that does not interfere with solder interconnect formation.

2. Description of the Related Art

Flip chip technology is well known in the art for electrically connecting a die (hereinafter, a "chip" or "flip chip") to a mounting substrate, such as a printed wiring board, or the like.

The active surface of the die is subject to numerous electrical couplings that are usually brought to the edge of the chip. Heat generation is significant at the active surface of the die, and consequently at the active surface of the chip. Electrical connections, referred variously to as balls, bumps, and others, are deposited as terminals on the active surface of a flip chip. The bumps include solders and/or plastics that make mechanical connections and electrical couplings to a substrate. The chip is inverted (hence, "flip chip") onto a mounting substrate with the bumps aligned to bonding pads on the mounting substrate. If the bumps are solder bumps, the solder bumps on the flip chip are soldered to the bonding pads on the substrate. A gap exists between the flip chip active surface and the mounting substrate.

One electronic device includes a flip chip and mounting substrate, among other things. One characteristic of flip chip technology is shear stress on the solder joints during temperature cycling of the device. This shear stress is partially a result of a difference in the coefficients of thermal expansion ("CTE") of the flip chip and the mounting substrate. Die materials such as silicon, germanium, and gallium arsenide, along with their packaging materials, may have CTEs in a range from about 3 ppm/° C. to about 6 ppm/° C. Mounting substrates are usually composites of organic-impregnated fiberglass dielectrics and metallic circuitry. These substrates may have CTEs in a range from about 15 ppm/° C. to about 25 ppm/° C. Consequently, a mismatch in the CTEs exists between the flip chip and the mounting substrate.

To reduce solder joint failures due to stress during thermal cycling, the solder joints are reinforced by filling the space between the flip chip and the mounting substrate, and around the solder joints, with an underfill composite. The two main processes that are commonly used to underfill the flip chip include the capillary underfill process and the no-flow underfill process.

A capillary underfill process typically proceeds by first aligning the solder bumps on a flip chip with the pads on a substrate and the solder is reflowed to form the solder joints. After forming the interconnect, the underfill is flowed between the flip chip and the mounting substrate. Thereafter, the underfill composite is cured. Capillary underfilling can be assisted by pumping the underfill composite between the flip chip and the mounting substrate, or by vacuum-assisted drawing the underfill composite between the flip chip and the mounting substrate.

The effectiveness of an underfill composite depends on its chemical, physical, and mechanical properties. Properties that make an underfill composite desirable include low CTE, low moisture uptake, high adhesion, high toughness, high glass transition (Tg) temperature, high heat distortion temperature, and others. The underfill composite includes particulate filler inorganics such as silica or the like, and metal flakes or the like. The particulate filler increases the modulus and acts as a CTE intermediary for the mismatched CTEs of flip chip and the mounting substrate. An example of a silica-filled composite is silica-filled, epoxy-based organics. However, the capillary underfill process that includes silica-filled composites or the like has technical challenges that are tedious, expensive, and sensitive to process rules and to chip size and shape. For example, particulate fillers in the underfill composite cause flowability to decrease between the flip chip active surface and the mounting substrate upper surface. Further, flow around the electrical bumps is also hindered by the increasingly smaller pitch and the increasingly smaller spacing between the flip chip and the mounting substrate.

In addition, the introduction of CTE-reducing filler particles in current underfill compositions of traditional flip chip packaging leads to a large viscosity increase, thus making it difficult for the underfill to flow by capillary forces. Furthermore, conventional flip chip packaging (with capillary flow underfill) is a costly multi-step and time consuming process which begins with solder reflow and interconnect formation, dispensing of the underfill and clean up of excess material, flow of underfill through capillary action and ends with curing of the underfill.

The no-flow underfill process avoids some challenges in the capillary flow underfill processes. In a no-flow underfill process, the underfill composite is dispensed on the mounting substrate or the flip chip, and the flip chip and the mounting substrate are brought into contact. The solder bumps on the chip and the pads on the substrate are aligned. Next, the underfill composite is cured prior to or substantially simultaneously with reflowing the solder to create the solder joints.

The no-flow underfill process also has technical challenges. The no-flow underfill material also must be made into a composite with the addition of a filler of silica or the like. Silica filler reduces the bump interconnection yield, because the filler gets deposited between the bumps and the pads such that electrical connections are not achieved.

Flip chip packaging with no-flow underfill is a much faster process than the capillary flow underfill process because solder interconnection and curing of the underfill occur simultaneously. However, a significant interconnection reliability problem is encountered due to the large concentration of filler necessary for the control of the CTE of the underfill. The interposition of these relatively large (microscale) filler particles between the solder bumps on the chip and the pads of the substrate during reflow gives rise to the interconnect reliability issues.

SUMMARY OF THE INVENTION

These and other problems associated with underfill compositions have been addressed by the inventors of the present invention. Specifically, the inventors have discovered that low CTE underfill based on organic-inorganic hybrid nano-structured materials can be formulated by curing a low viscosity and relatively rigid tetra-functional epoxy resin with octaaminophenyl silsesquioxane. These hybrid materials are considered molecular level compositions and as such, do not interfere with solder interconnect formation, in contrast to the conventional underfill compositions containing larger scale size filler particles.

In one embodiment of the invention,

DESCRIPTION OF THE PREFERRED EMBODIMENT

One embodiment relates to a system that includes a flip chip and a mounting substrate with an underfill mixture that exhibits a coefficient of thermal expansion (CTE) that is characteristic of inorganic-filled underfill composites previously known, among other properties. The underfill mixture includes a principal underfill composition selected from silesquioxanes, thermosetting liquid monomers, combinations thereof, and others as will be further delineated according to various embodiments.

One embodiment includes a method of assembling the flip chip and the mounting substrate.

The following description includes terms, such as "upper", "lower", "first", "second", etc. that are used for descriptive purposes only and are not to be construed as limiting. The embodiments of a device or article of the present invention described herein can be manufactured, used, or shipped in a number of positions and orientations. The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. The term "chip" as used herein refers to a die that has been encapsulated in an organic, an inorganic, or a combination organic and inorganic housing. A "board" is typically a resin-impregnated fiberglass structure that acts as a mounting substrate for the chip.

Figure 1A:
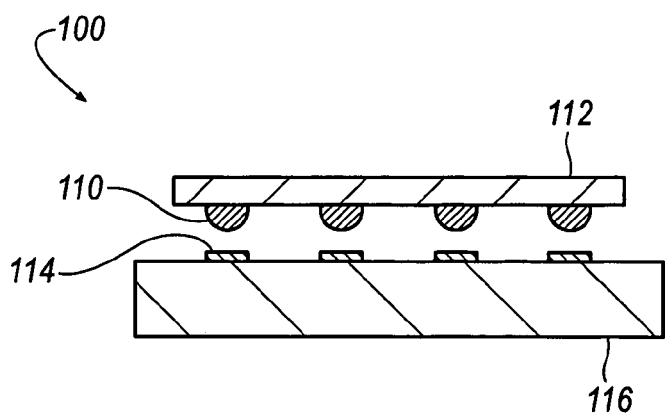
FIG. 1A is a cross-section of a package during an underfill process according to an embodiment.

FIG. 1A is a cross-section of a package during an underfill process according to an embodiment. In FIG. 1, a package 100 is depicted during a capillary underfill process. The package 100 includes a solder bump 110 that is attached to a flip chip 112. Electrical coupling for the flip chip 112 is accomplished through a bond pad 114 that is landed on a mounting substrate 116.

Figure 1B:
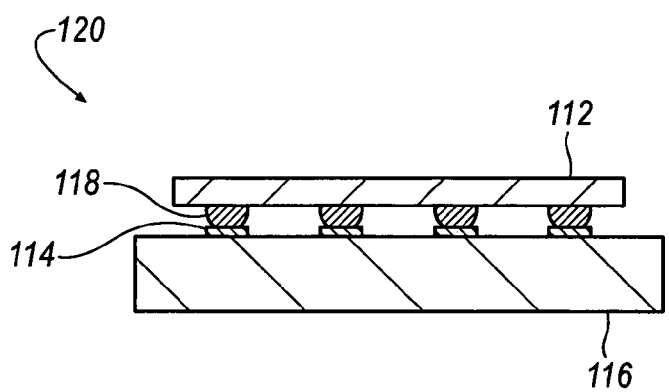
FIG. 1B is a cross-section of the package depicted in FIG. 1A after further processing.

FIG. 1B is a cross-section of the package depicted in FIG. 1A after further processing. In FIG. 1B, the flip chip 112 and the mounting substrate 116 are aligned and brought together.

Next, reflow of the solder bump 118 is carried out. A reflowed solder bump 118 is depicted, and a flip chip assembly 120 includes the flip chip 112 and the mounting substrate 116 as bonded.

Figure 1C:
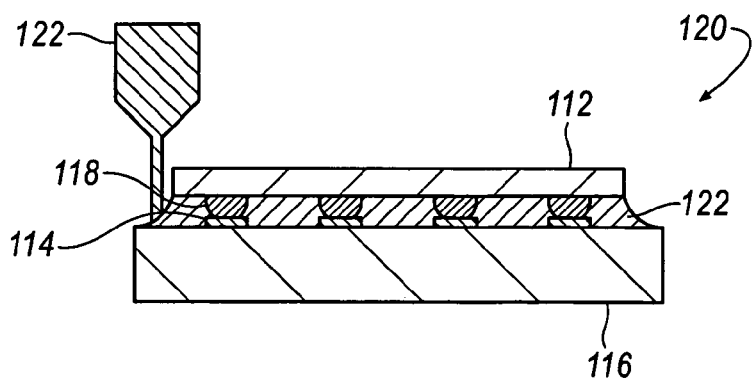
FIG. 1C is a cross-section of the package depicted in FIG. 1B after further processing.

FIG. 1C is a cross-section of the package depicted in FIG. 1B after further processing. An underfill mixture 122 according to an embodiment is applied to the flip chip assembly 120 under conditions that cause a wicking action of the underfill mixture between the flip chip 112 and the mounting substrate 116. Underfill mixture 122 has unique formulations, according to various embodiments, and will be described below in greater detail.

Figure 1D:
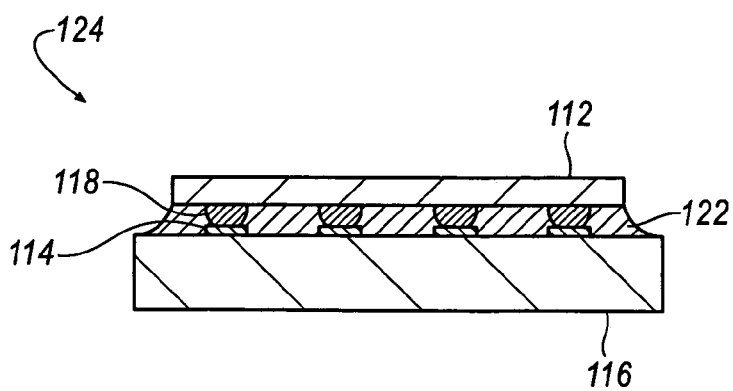
FIG. 1D is a cross-section of the package depicted in FIG. 1C after further processing.
Figure 2A:
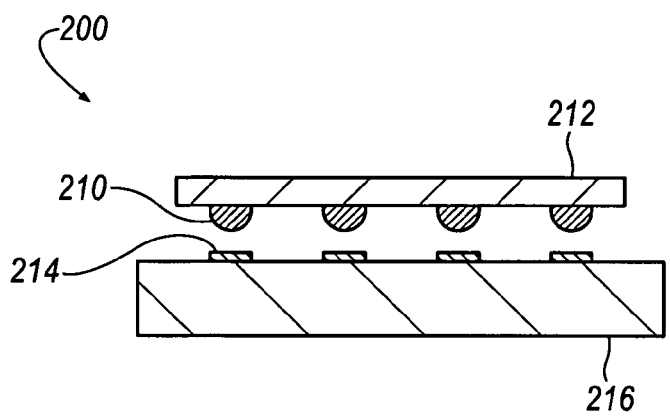
FIG. 2A is a cross-section of a package during a no-flow underfill process according to an embodiment.

FIG. 1D is a cross-section of the package depicted in FIG. 1C after further processing. A curing process is carried out to achieve a chip package 124. The curing process is carried out according to specific embodiments. In one embodiment, curing the mixture is done by an autocatalytic process. The autocatalytic process is carried out in one embodiment by providing a reactive diluent in the underfill mixture 122. In another embodiment, the curing process is carried out by an additive catalytic curing process. The additive catalytic curing process includes an additive such as a metal catalyst powder that causes the underfill mixture 122 to cure. In another embodiment, a cross-linking/hardening process is carried out to cure the underfill mixture 122. Examples of specific cross-linker/hardener composition are set forth herein. In another embodiment, a thermoset curing process is carried out. Typically, several curing process embodiments are assisted by thermal treatment. However, in some embodiments, such as the use of a liquid thermoset monomer, thermoset processing may be done without other curing agent processes FIG. 2A is a cross-section of a package 200 during a no-flow underfill process according to an embodiment. The package 200 includes a solder bump 210 that is attached to a flip chip 212. Electrical coupling for the flip chip 212 is accomplished through a bond pad 214 that is landed on a mounting substrate 216.

Figure 2B:
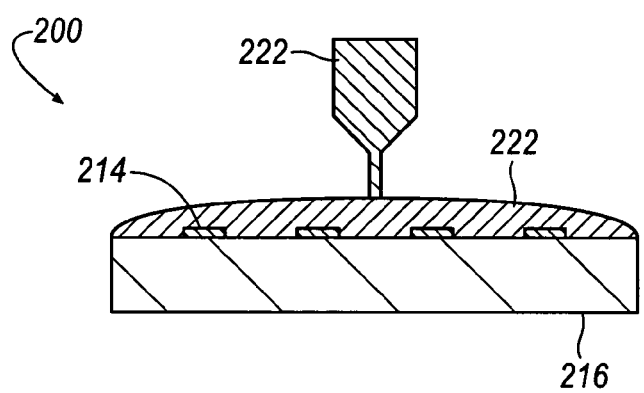
FIG. 2B is a cross-section of the package depicted in FIG. 2A after further processing.

FIG. 2B is a cross-section of the package 200 depicted in FIG. 2A after further processing. An underfill mixture 222 according to an embodiment is applied, either to the flip chip 212 or to the mounting substrate 216. In FIG. 2B, the underfill mixture 222 is depicted as being deposited upon the mounting substrate 116, although it may alternatively deposited upon the flip chip 212 (FIG. 2A). Underfill mixture 222 has unique formulations, according to various embodiments, and will be described below in greater detail.

Figure 2C:
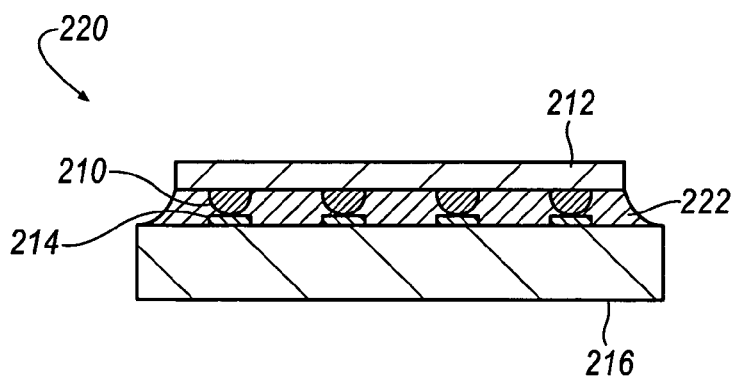
FIG. 2C is a cross-section of the package depicted in FIG. 2B after further processing.

FIG. 2C is a cross-section of the package 200 depicted in FIG. 2B after further processing. Next, the flip chip 212 and the mounting substrate 216 are aligned and brought together to form a flip chip assembly 220 that includes the uncured underfill mixture 222 and the not yet reflowed solder bump 210.

Figure 2D:
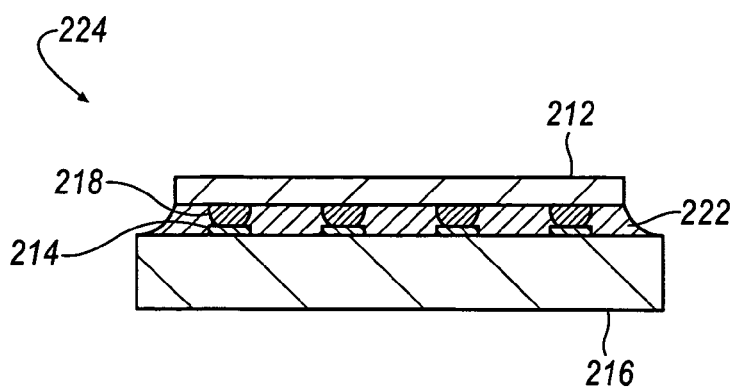
FIG. 2D is a cross-section of the package depicted in FIG. 2C after further processing.

FIG. 2D is an elevational cross-section of the flip chip assembly 220 depicted in FIG. 2C after further processing. A curing process is carried out to achieve a chip package 224. The curing process is carried out according to specific embodiments. In one embodiment, curing is followed by reflowing of the solder bump 210 (FIG. 2C) onto the bond pad 214 to form a reflowed solder bump 218. In another embodiment, curing and reflowing are carried out substantially simultaneously. As in the embodiment depicted in FIGS. 1C and 1D, curing may be carried out by various processing paths including autocatalytic, additive catalytic, diluent cross-linking/hardening, thermoset, and a combination thereof.

According to an embodiment, the solder bumps 110 and 210 include substantially Pb-free solder technology that is being developed in the art. In another embodiment, the solder bumps 110 and 210 are Pb-containing solder. By "substantially Pb-free solder", it is meant that the solder is not designed with Pb content according to industry trends.

One example of a Pb-containing solder includes a tin-lead solder. In selected embodiments, Pb-containing solder is a tin-lead solder composition such as from Sn97Pb. A tin-lead solder composition that may be used or a Sn37Pb composition. In any event, the Pb-containing solder may be a tin-lead solder comprising $Sn_x Pb_y$, wherein x+y total 1, and wherein x is in a range from about 0.3 to about 0.99. In one embodiment, the Pb-containing solder is a tin-lead solder composition of Sn97Pb. In another embodiment, the Pb-containing solder is a tin-lead solder composition of Sn37Pb.

A substantially Pb-free solder in one embodiment includes an Sn90-98Ag10-2Cu2-0 solder as is known in the art. Specifically, one such composition is $Sn_{97}Ag_{2.5}Cu_{0.5}$.

Underfill Formulations

Some desirable properties of underfill mixtures include a high modulus, low viscosity at the time of dispensing onto a chip and/or substrate, low CTE and good adhesion to the interfaces post cure, so that no delamination at the interface occurs during device testing and field use. Some other desirable properties of underfill mixtures include a high glass-transition (Tg) temperature, and a low moisture uptake.

According to various embodiments, the principal underfill compositions include at least one of silesquioxanes, thermosetting liquid monomers, and mixtures thereof.

The most common thermosetting liquid monomers used in the packaging of electronic components are formulated from epoxy resins. This is due to their widely recognized properties of excellent adhesion to a variety of substrates, high strength, good thermal stability, absence of volatile by-products during cure, and ease of processing. The epoxy resins are a family of products that range in properties from low viscosity liquids to solids having high molecular weights. As such, they provide a broad latitude in formulating compositions for a variety of applications. Another equally important aspect of epoxy resins is their ability of curing or reacting with several functional groups of other materials to produce thermosetting compositions of wide ranging properties.

In applications involving electrical or electronic components, epoxy resin thermosets provide excellent electrical insulating properties, dielectric and resistivity characteristics and retain such properties under severe operating conditions. A special electronic packaging application of epoxy resins involves their utilization as underfill materials in flip chip packaging technology. The underfill functions both as an adhesive providing mechanical stability to the assembly and as a material that bridges the mismatch in the coefficient of thermal expansion (CTE) that exists between the chip and the substrate. Thus, the key to a successful flip chip packaging is the availability of a low CTE adhesive underfill.

Most formulated epoxy resins have CTE values that are greater than 70 ppm/° C. The few epoxy formulations that have been reported to possess lower CTE values may have detrimental properties for underfill applications. These include formulations with curing characteristics that are not compatible with solder relow profiles, formulations having processing properties that are not practical for this application, and formulations with low glass transition temperatures ($T_g$). High glass transition temperatures are necessary since the CTE values of most organic thermosets above $T_g$ are at least twice as high as their values below $T_g$. In some applications, electronic packages are exposed to high temperatures (such as automotive applications), thus requiring resin formulations with high $T_g$. On the other hand, high performance integrated circuits emit sufficient amounts of heat which can cause reliability problems with low $T_g$ thermosetting materials. The traditional method of lowering the CTE of thermosetting compositions involves the addition of low CTE filler particulate, such as glass beads or silica particles. However, the addition of such materials results in a large rise in the viscosity of the underfill and in the particular case of no-flow underfill, results in the interposition of these particles between the solder bumps and the substrate, thus compromising the electrical connection. It is, therefore, essential that no-flow underfill materials are free of the traditional large filler particles (average size on the micron scale).

In response to these challenges, the inventors have successfully developed an organic-inorganic hybrid material that has low coefficient of thermal expansion yet possess good processing characteristics and curing profiles that is compatible with solder reflow process. These organic-inorganic hybrids are based on nanometer-sized polyhedral oligosilsesquioxane (POSS) monomers which possess a cage-like silicate structure functionalized with reactive or polymerizable functionalities. Upon reaction with an appropriate organic reactant (e.g. curing agent), these POSS monomers provide compositions with a nano-scale (1-2 nm) homogeneous dispersion of silica-like structure. These hybrid materials resemble polymer compositions containing nano-scale filler particles but with the added advantage of the POSS cage being covalently linked to the organic part of the composition. Such nanocompositions have frequently exhibited synergistic properties that are derived from the individual properties of both the organic and the inorganic components.

Studies have shown that the introduction of nanostructured functionalized POSS molecules in thermoplastic or thermosetting polymer compositions leads to increased glass transition temperature ($T_g$), increased thermal stability, improved flammability and oxidation resistance, and lower dielectric constant. Although many POSS/epoxy nanostructured thermosets have been studied, there is only a single reported study in which an attempt was made to develop a low CTE underfill compositions for electronic packaging applications. In this study, epoxy functionalized or tethered POSS monomers were reacted with polyamine as a curing agent to produce high $T_g$ thermoset compositions. The CTE values of these hybrid thermosets, however, were in the same range as those obtained from traditional unfilled epoxy resin formulations. The functional epoxy tether on the POSS cage [octaglycidyldimethylsiloxyoctasilsesquioxane or octa (ethylcyclohexyl epoxide) dimethylsiloxysilsesquioxane] and the diamine curing agents [poly(propylene oxide) diamine or 1,3 diaminopentane] used in that study have flexible structures. It appears that the reported high CTE values are a direct results of the excessive flexibility of the chains connecting the highly crosslinked POSS monomers.

The inventors have discovered that a simple replacement of the flexible crosslinking diamine by a more rigid diamine curing agent by itself does not lower the CTE of cured epoxy functional POSS nanocomposites. The inventors have also discovered that when a low viscosity tetrafunctional epoxy resin with a relatively rigid structure is reacted or cured with a rigid amine functionalized POSS monomer, the resulting organic/inorganic hybrid compositions have CTE values that can be as low as 20 ppm/° C. One such hybrid underfill mixture is depicted below.

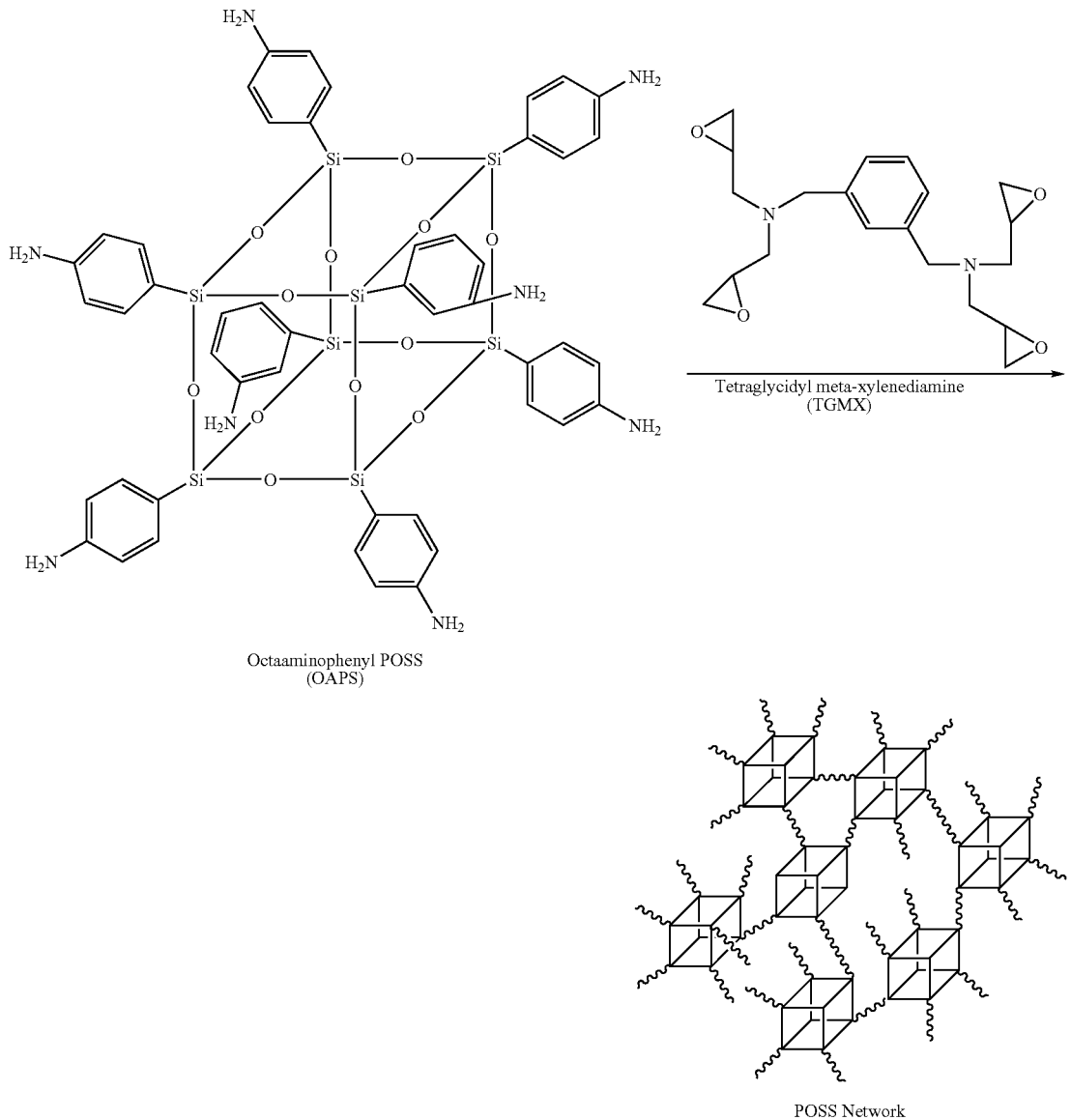

Preparation of POSS-Based Epoxy Thermosets

Tetraglycidyl meta-xylenediamine (TGMX) is a tetrafunctional epoxy resin. It is a clear liquid with a viscosity of 1600-3000 cps at 25° C. and an epoxy equivalent weight of 90-110 g/eq. Octaglycidyldimethylsiloxy octasilsesquioxane (OG), octa(ethylcyclohexyl epoxide) dimethylsiloxy silsesquioxane (OC), and octa(aminophenyl) silsesquioxane (OAPS) were synthesized using procedures well-known in the art.

Di(amino) diphenylmethane (DDM), dimethyldi(amino) diphenyl methane (MDDM), di(amino)dicyclohexyl methane (CHA), and di(amino)diphenyl sulfone (DDS) were used as curing agents for OC and OG.

Compositions of the specific amino and epoxy compounds were prepared by mixing stoichiometric concentrations (one epoxy equivalent weight per amine hydrogen equivalent) of the two components in a glass container until the solution is homogeneous. Solvent (THF or methanol) is added to the mixture if needed. The mixture is poured into a rectangular mold and placed in a vacuum oven to remove air bubbles and/or solvent. The mold is then placed in an oven and the composition is cured at a temperature between 105-200° C. for 2 hours.

Additive Materials

Additive materials are included with the principal underfill compositions. The additive materials and the principal underfill compositions constitute "underfill mixtures" according to embodiments set forth herein.

In some formulations, nano-alumina, trimethoxy(aminopropyl) silane and/or glymo are added to the epoxy/amine mixture and dispersed using ultrasonic homogenizer. We have discovered that the addition of nano-alumina powder in the range from about 5-15 weight %, and preferably about 10 weight % of nano-alumina powder, or trimethoxy(aminopropyl) silane in the range of about 1-3 mole %, and preferably 2 mole % vastly improves the wettability and overall quality of silsesquioxane nanocomposites. Furthermore, a small reduction in the CTE was obtained by the incorporation of nano-alumina.

Thermal Analysis Data

The coefficient of thermal expansion of all cured compositions were measured on polished (400 grit SiC sandpaper) specimens using a thermo-mechanical analyzer under He atmosphere with a heating rate of 10° C./minute from 30° C. to 120° C.

The data in Table 1 show that when silsesquioxane is functionalized with flexible long chain epoxides (OG and OC) and then cured with a diamine, high CTE compositions are formed, even though the diamine curing agent has a rigid (non-flexible) structure.

On the other hand, when the rigid octaaminophenyl silsesquioxane (OAPS) is used as the curing agent for the tetrafunctional, low viscosity, and relatively rigid TGMX epoxy resin, compositions having very low CTE values are obtained (Table 2). Since there is no apparent glass transition temperature for these compositions, their CTE values are reported in the temperature range below 150° C. However, for formulations containing 10% nano-alumina, the CTE value rose from 20 ppm/° C. to 27 ppm/° C. as the temperature approached 230° C.

TABLE 1

CTE Values of Amine Cured Epoxy Functionalized POSS

| Epoxy Functional POSS | Amine | CTE (ppm/° C.) |
|---|---|---|
| OG | DDM | 164 |
| OG | DDS | 182 |
| OG | MDDM | 146 |
| OC | MDDM | 109 |
| OC | DDS | 77 |

TABLE 2

CTE Values of Tetraglycidyl m-xylene diamine
Cured with Octaminophenyl Functionalized POSS

| Epoxy | Amine | Wt. % Nano-alumina | CTE (ppm/° C.) |
|---|---|---|---|
| TGMX | OAPS | | 25 |
| TGMX | OAPS | 10 | 20 |
| TGMX | 50% OAPS/50% DDM | | 56 |
| TGMX | 50% OAPS/50% DDM | 10 | 50 |
| TGMX | 90% OAPS/10% DDM | | 53 |
| TGMX | 90% OAPS/10% DDM | 10 | 47 |

TABLE 2-continued

CTE Values of Tetraglycidyl m-xylene diamine
Cured with Octaminophenyl Functionalized POSS

| Epoxy | Amine | Wt. % Nano-alumina | CTE (ppm/° C.) |
|---|---|---|---|
| TGMX | 50% OAPS/50% CHA | | 64 |
| TGMX | 50% OAPS/50% CHA | 10 | 53 |

As described above, when the rigid octaaminophenyl silsesquioxane (OAPS) is used as the curing agent for the tetrafunctional, low viscosity, and relatively rigid TGMX epoxy resin, compositions having very low CTE values are obtained.

While the invention has been specifically described in connection with certain specific embodiments thereof, it is to be understood that this is by way of illustration and not of limitation, and the scope of the appended claims should be construed as broadly as the prior art will permit.

What is claimed is:

1. A packaging system, comprising:
    a flip chip on a mounting substrate;
    an underfill mixture between the flip chip and the mounting substrate, wherein the underfill mixture includes a principal underfill composition of a rigid octaaminophenyl silsesquioxane (OAPS) and a tetrafunctional, low viscosity TGMX epoxy resin.

2. A packaging system according to claim 1, wherein the underfill mixture includes nano-alumina powder in a range from about 5-15 weight %.

3. A packaging system according to claim 1, wherein the underfill mixture includes trimethoxy(aminopropyl) silane in a range of about 1-3 mole %.

4. A chip package, comprising:
    a chip including an active surface;
    a mounting substrate including an upper surface that faces the active surface;
    electrical coupling between the active surface and upper surface; and
    an underfill mixture between the upper surface and the active surface, wherein the underfill mixture includes a principal underfill composition of a rigid octaaminophenyl silsesquioxane (OAPS) and a tetrafunctional, low viscosity TGMX epoxy resin.

5. A chip package according to claim 4, wherein the underfill mixture includes nano-alumina powder in a range from about 5-15 weight %.

6. A chip package according to claim 4, wherein the underfill mixture includes trimethoxy(aminopropyl) silane in a range of about 1-3 mole %.

* * * * *